United States Patent [19]

Liken et al.

[11] Patent Number: 5,191,282
[45] Date of Patent: Mar. 2, 1993

[54] UNITIZED TEST SYSTEM WITH BI-DIRECTIONAL TRANSPORT FEATURE

[75] Inventors: Peter A. Liken, West Olive; Robert J. Holmes, Grand Rapids; George J. Bouwman, Saugatuck, all of Mich.

[73] Assignee: Venturedyne, Ltd., Milwaukee, Wis.

[21] Appl. No.: 780,623

[22] Filed: Oct. 23, 1991

[51] Int. Cl.$^5$ .................... G01R 31/02; H01R 13/631
[52] U.S. Cl. ................................ 324/158 F; 439/310
[58] Field of Search .................. 324/158 F, 501, 73.1, 324/537, 538; 439/131, 132, 152, 310

[56] References Cited

U.S. PATENT DOCUMENTS

| | | | |
|---|---|---|---|
| 3,656,058 | 4/1972 | Leathers | 324/158 F |
| 4,145,620 | 3/1979 | Dice | 324/501 |
| 4,683,424 | 7/1987 | Cutright et al. | 324/158 F |
| 4,692,694 | 9/1987 | Yokoi et al. | 324/158 F |
| 4,695,707 | 9/1987 | Young | 324/158 F |
| 4,745,354 | 5/1988 | Fraser | 324/158 F |
| 4,986,778 | 1/1991 | Liken et al. | 439/74 |

*Primary Examiner*—Ernest F. Karlsen
*Attorney, Agent, or Firm*—Jansson & Shupe, Ltd.

[57] ABSTRACT

An improved system for testing electrical circuit boards in an environmental test chamber includes a carrier moveable into and out of the chamber. The carrier supports a relatively large number of printed circuit boards to be tested by exposure to extremes of temperature, for example. Each board is electrically linked to a carrier-mounted multiple-conductor "gang" connector. The chamber has a multiple-conductor gang receptacle into which the connector is plugged as the carrier moves fully into the chamber. Such arrangement provides a way to electrically monitor board testing by instruments outside the chamber. An automated insertion/extraction assembly powers the carrier between an interconnect position and a disconnect position. The circuit boards are handled as a group of "unit" and the assembly provides both automatic connection and disconnection upon initiation by the chamber operator. Circuit board testing may thereby be accomplished accurately and more expeditiously than with earlier systems.

17 Claims, 5 Drawing Sheets

UNITIZED TEST SYSTEM WITH BI-DIRECTIONAL TRANSPORT FEATURE

FIELD OF THE INVENTION

This invention relates generally to environmental test chamber systems and, more particularly, to such a system used for testing electrical printed circuit boards.

BACKGROUND OF THE INVENTION

Environmental test chambers are widely use for component and product testing including but not limited to temperature testing. As an example (and depending upon the particular application), electrical printed circuit boards are tested under extremes of temperature. It is not unusual to subject such boards to temperature excursions from −40° C. to +125° C. (about equal to −40° F. to 260° F.) and excursions down to −54° C. are used for military applications. And rates of temperature change per minute may be in the 3° C. to 20° C. range.

Exposure to such temperature changes provides an accelerated test, dramatically shortening the time required to "prove" board designs and cull out boards which may fail prematurely. Such exposure is not unlike that which might be experienced by a high performance military aircraft flying from ground level to very high altitude in a matter of minutes.

One of the factors affecting cost of circuit board testing is the degree of manual board handling required to be used over the course of the test. In one arrangement shown in U.S. Pat. No. 4,683,424 (Cutright et al.) a circuit board test apparatus uses a relatively large number of baskets, each containing a number of circuit boards to be tested. Each basket, not unlike a file drawer in appearance, has an electrical connector on its end wall. All boards in the basket are electrically attached to this connector which, in turn, is connected to a connector on the cart by which all such baskets are carried. To test, the cart connector is plugged into a connector on a wall of the test chamber. In another arrangement, individual drawer-like baskets are placed into a chamber rack and plugged to a basket-dedicated connector on the rear chamber wall.

It is apparent from the foregoing that basket handling time can be very significant. And connection and disconnection to and from such wall connector(s) is difficult in that the connector insertion and withdrawal forces are substantial. Even though the cart has a manual latching arrangement, the overall configuration is somewhat cumbersome.

An improved system for testing electrical circuit boards which uses a movable carrier for supporting the boards in a "unitized" arrangement and which has a powered insertion/extraction assembly for easily and automatically transporting the carrier in either of two directions would be an important advance in the art.

OBJECTS OF THE INVENTION

It is an object of the invention to overcome some of the problems and shortcomings of the prior art including but not limited to those mentioned above.

Another object of the invention is to provide an improved system for testing electrical circuit boards wherein the entire "unit" of boards is powered for movement to substantially simultaneously connect them to and disconnect them from the chamber.

Another object of the invention is to provide an improved system for testing electrical circuit boards wherein such powered movement is automatic in either direction upon operator initiation.

Still another object of the invention is to provide an improved system for testing electrical circuit boards wherein board and component handling is minimized. How these and other objects are accomplished will become apparent from the following detailed description taken in conjunction with the drawing.

SUMMARY OF THE INVENTION

The invention is an improved system for testing electrical circuit boards in an environmental test chamber. Such chamber is used to expose the boards to rapidly-changing extremes in temperature, for example. Such exposure dramatically accelerates board testing (and permits more rigorous and thorough testing) as compared to testing by installation of the board in the related product.

Environmental test chambers are often embodied as box-like structures having a front door for carrier placement and withdrawal and an opposing rear wall. Chambers used for temperature testing are well insulated and are equipped with heating and refrigeration units for rapid temperature change.

The improved system includes a carrier which can be moved into and out of the chamber. The carrier supports plural circuit boards, e.g., 90–100 of such boards, each of which is electrically connected or "linked" to a connection device such as a carrier-mounted, multiple-conductor "gang" connector. Such connection device is preferably "unitized;" that is, all conductors are grouped in a single, relatively small area. The device is of back plane type in that it is mounted on the rear portion of the carrier. Mounting is preferably by a floating mount which permits slight aligning movement of the connection device as it connects to a receptacle device.

The receptacle device is preferably on the rear chamber wall opposite the door and is likewise preferably unitized by grouping connection points. The connection and receptacle devices make linear "stabbing" connection as the carrier moves toward the rear chamber wall. When circuit boards are handled and moved by a single carrier as a single group or "unit," the device connecting and disconnecting forces are relatively high. And the carrier is rather heavy when loaded with circuit boards.

An insertion/extraction assembly powers the carrier for movement between an interconnect position and a disconnect position. The circuit boards are thereby substantially simultaneously connected to or disconnected from the receptacle device—as a unit and without resorting to excessive manual carrier or board manipulation. The assembly provides both automatic connection and disconnection upon initiation by the chamber operator. Board handling and test setup time are materially reduced, testing is much more convenient and accomplished accurately and more expeditiously than with earlier systems.

The insertion/extraction assembly includes at least one and preferably two actuators motor-driven for carrier movement. More specifically (and after manual partial insertion of the carrier into the chamber by a cart), the actuators attach to and move the carrier toward the rear chamber wall to interconnect with the receptacle device or away from such wall to disconnect.

Each actuator has a hook-like member movable linearly and pivotably for automatic carrier coupling and de-coupling. Each hook-like member has an insertion face and an extraction face, one of which bears against a force member, e.g., a protruding pin, on the carrier for connection or disconnection, respectively. Pivoting movement is by a cam mechanism of the pin-and-groove type. The pin is on the hook-like member and grooves are configured in each of a pair of stationary plates adjacent to and at either side of the member. As the actuator and hook-like member move along a relatively small portion of their total travel distance and in a "carrier out" direction, the cam mechanism de-couples the member from the carrier. Since the connection device has prior been disconnected from the receptacle device, the carrier can then be withdrawn from the chamber.

In the case of two actuators, the preferred embodiment for larger systems, drive is by a common line shaft for substantially synchronous actuator movement. Synchronous movement is preferred to avoid the imposition of what is known as a force "couple" on the carrier. As is widely recognized in the mechanical engineering arts, a force couple is a pair of equal forces acting in parallel but opposite directions. To state it another way, synchronous movement helps avoid "torquing" or twisting the carrier.

And the actuators are aligned with the connection device to avoid the imposition of a force couple on such device. Absent such alignment, there would be a tendency to cause the device to tip or twist, thereby impairing the ability of the devices to interconnect.

In addition to the actuators and common line shaft, the assembly includes a platform and drive motor. The shaft, platform, drive motor and all but relatively short lengths of the actuators are mounted exterior the chamber. Such location of this relatively large mass helps decrease the thermal load on the heating and refrigeration units. In other words, by such placement of the aforementioned components, they will neither absorb heat or require cooling inside the chamber.

The drive motor is connected to and powered from a motor control circuit, certain details of which will now be described. In a chamber prepared for testing, a rectangular, frame-like fixture is attached to the chamber floor. Such fixture has a position switch mounted thereon and wired into the control circuit. The fixture receives the carrier and when the carrier is properly positioned on the fixture for coupling by the assembly, the switch is closed. This permits (but does not require) motor energization. Positioning of the carrier on the fixture is by a cart and the control circuit includes a cart switch which is closed when the cart is sufficiently withdrawn from the chamber.

The chamber includes a door switch closed when the chamber door is open and like that of the cart switch such switch closure permits motor energization. In this way, movement of the carrier further into the chamber to the interconnect position may be observed And carrier movement outward to the disconnect position is prevented, thereby avoiding possible damage to the door and chamber.

In a highly preferred embodiment, it is desirable to move the carrier relatively slowly when the connection and receptacle device are being connected or disconnected. On the other hand, the carrier can safely be moved more rapidly when approaching connection or after disconnection. Accordingly, the control circuit provides plural rates of carrier movement including a lower-speed rate for device connection and disconnection.

The electric drive motor armature, connected line shaft and the like have rather significant mass. It is risky to instantaneously reverse the direction of motor rotation as drive component breakage may well result -and the carrier-mounted boards may be damaged by resulting "jerky" movement. To help prevent such eventualities, the preferred motor control circuit also includes a timing switch delaying reversal of the drive motor. In the described embodiment, two timing switches are included, one for each direction. Delay is for about three seconds permitting the armature and shaft to coast to a stop (or virtual stop) before the motor is energized for reverse rotation.

The control circuit also includes primary switches which "set" the interconnect and disconnect positions of the carrier by limiting actuator travel. In the preferred embodiment, such switches are stationary mounted and the moving actuator has a "dog" which trips a switch for slowdown or at a limit of travel. Of course, another arrangement (more difficult because of the need for sliding electrical contacts) is to mount the switches on the moving actuator and the dog stationary.

There are also switches redundant to the primary switches. In event of a primary switch failure, its redundant "backup" switch opens to stop actuator (and carrier) movement.

Further details of the invention are set forth in the following detailed description taken in conjunction with the drawing.

DETAILED DESCRIPTION OF PREFERRED EMBODIMENTS

Figure 1:
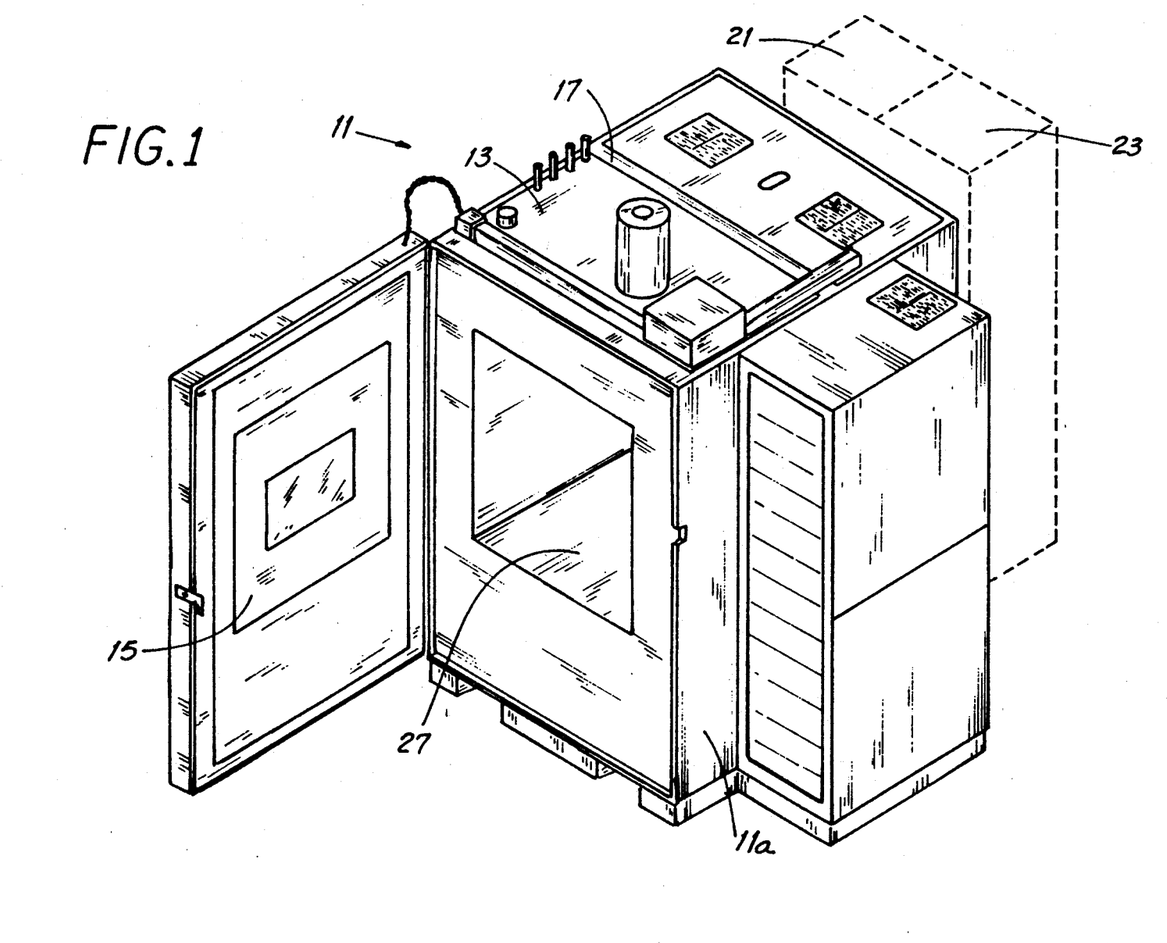
FIG. 1 is a representative isometric view of an environmental test chamber with portions shown in dashed outline.
Figure 2:
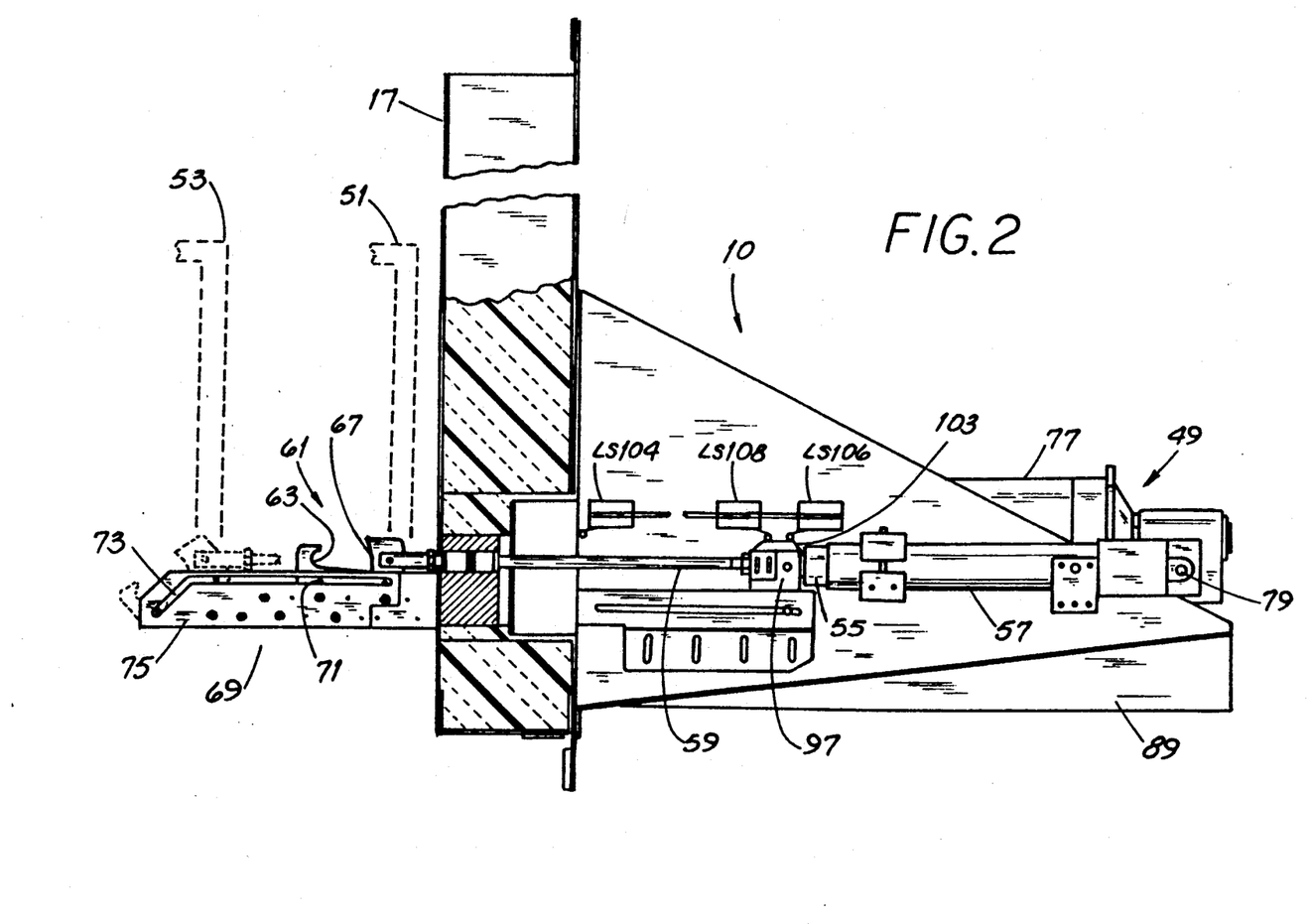
FIG. 2 is a side elevation view of an insertion/extraction assembly shown in conjunction with the rear wall of the chamber of FIG. 1, with parts broken away, and shown in conjunction with carrier positions shown in dashed outline.
Figure 7:
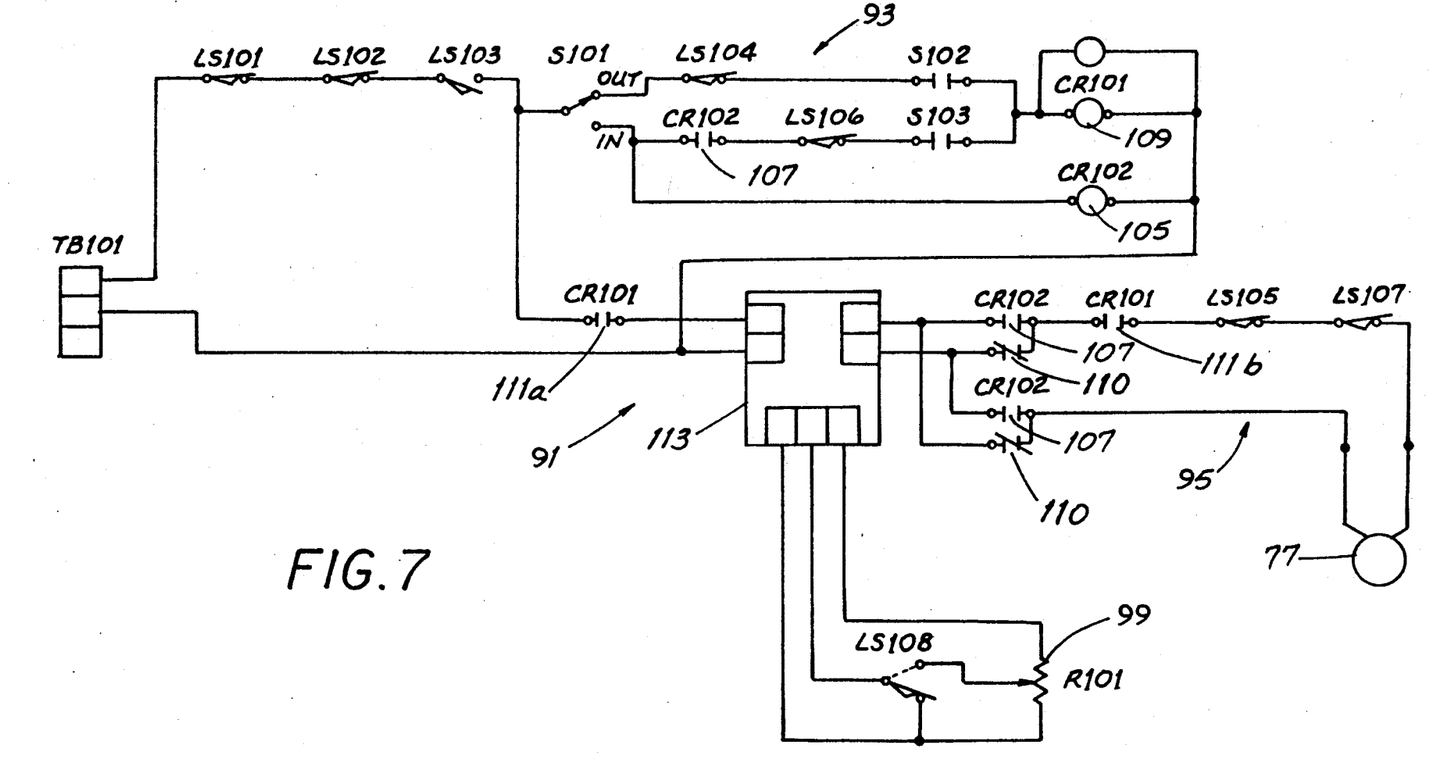
FIG. 7 is an electrical schematic diagram of the assembly drive motor control circuit.

Referring first to FIGS. 1 and 7, an environmental test chamber 11 is embodied as a box-like structure having side walls 11a, a top 13, a front door 15 for carrier placement and withdrawal and an opposing rear wall 17. As shown in FIG. 2, walls (like wall 17) in chambers used for temperature testing are, in fact, double walls with insulation 19 therebetween. The chamber 11 is equipped with heating and refrigeration units, symbolically represented at 21 and 23, respectively, for rapid temperature change. The chamber 11 includes a cart switch LS101 and a door switch LS102 used for motor control as described below.

Figure 3:
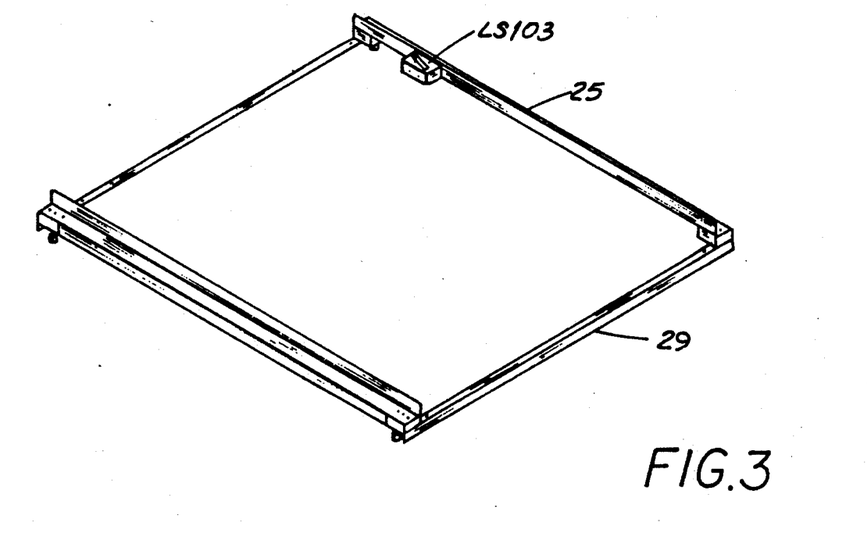
FIG. 3 is a perspective view of a fixture used in the chamber of FIG. 1.
Figure 4:
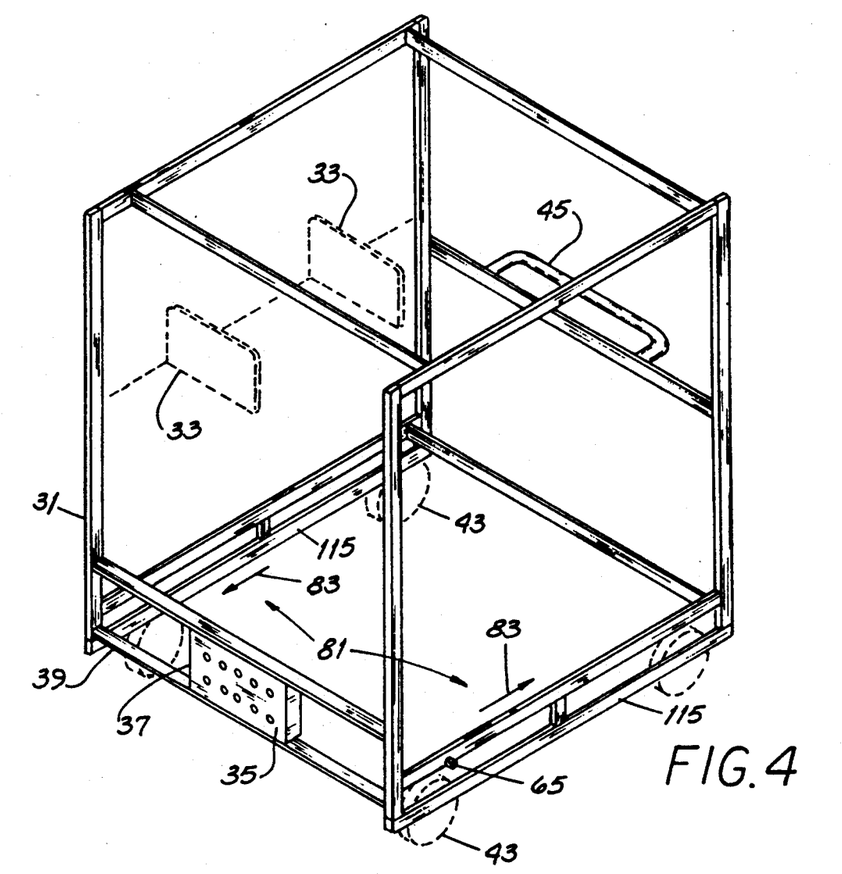
FIG. 4 is a simplified representative view of a carrier for supporting multiple circuit boards (shown in dashed outline) for testing. A wheeled carrier configuration is also shown in dashed outline.

Referring additionally to FIGS. 3 and 4, the chamber 11 also includes a fixture 25 attached to the chamber floor 27 with its front angle 29 adjacent to the door 15. The fixture 25 includes a position switch LS103 for motor control as later described.

The improved system 10 includes a carrier 31 which can be moved into and out of the chamber 11. The carrier 31 supports plural circuit boards 33, e.g., 90–100 of such boards 33, each of which is electrically connected or "linked" to a connection device 35 such as a carrier-mounted, multiple-conductor "gang" connector. Such connection device 35 is preferably "unitized;" that is, all conductors are grouped in a single, relatively small area 37. The device is of back plane type, i.e., it is mounted on the rear portion 39 of the carrier 31. Mounting is preferably by a floating mount which permits slight aligning movement of the connection device 35 as it connects to a receptacle device.

Figure 6:
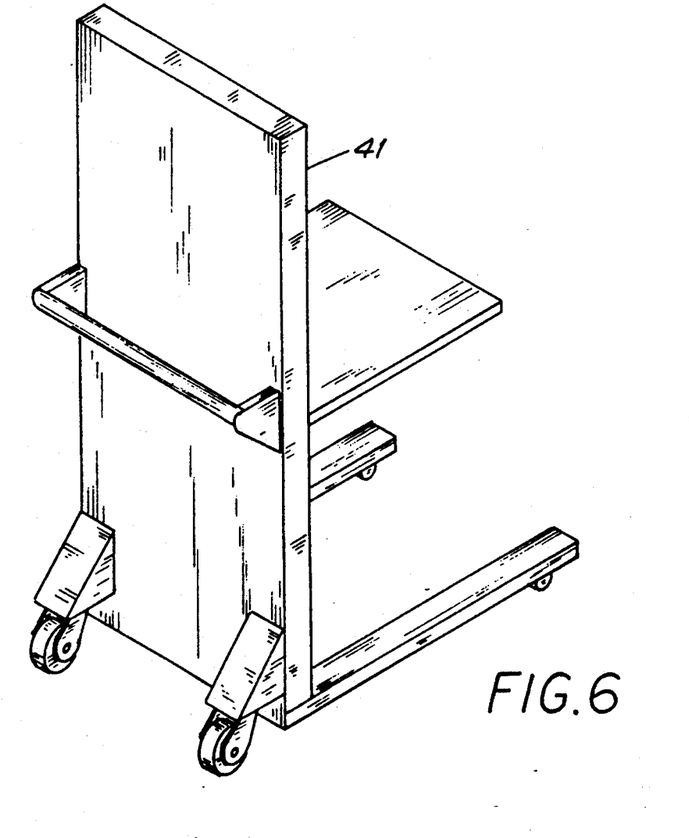
FIG. 6 is a simplified representative view of a cart for moving the carrier.

In the configuration shown in solid outline in FIG. 4, the carrier 31 is initially placed in the chamber 11 by a cart 41 like that of FIG. 6. In the support arrangement shown in dashed outline in FIG. 4, the carrier 31 is self-supported on wheels 43 for easy operator placement in such chamber 11, thereby obviating need for a separate carrier cart 41. In such arrangement, a grasping handle 45 is provided for operator use placing such carrier 31.

In the preferred arrangement, the connection device 35 is the female portion of the connection. Since the carrier 31 is moved about frequently (including movement about the building test area) and since its rear portion 39 may be inadvertent bumped against a wall or other obstruction, such arrangement helps prevent pin or prong bending as might occur with a male portion.

Figure 5:
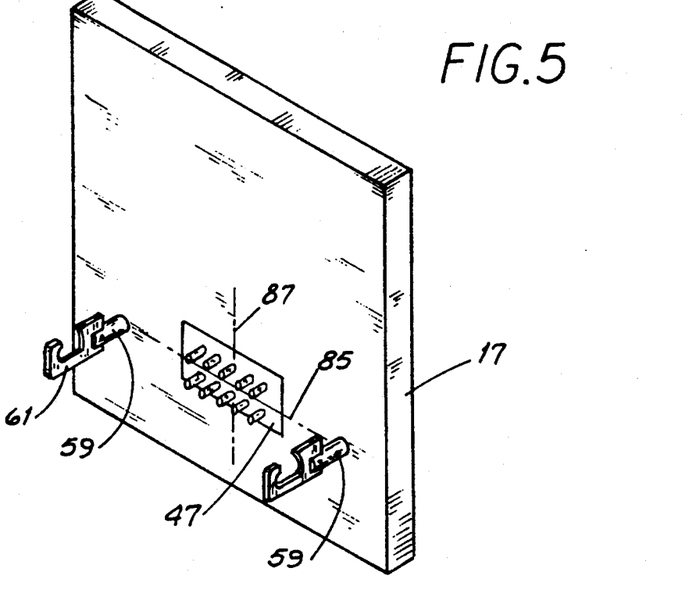
FIG. 5 is a perspective view of a portion of the inside rear wall of the chamber showing the location of the actuator rods and receptacle device.

As shown in FIG. 5, the receptacle device 47 is preferably on the rear chamber wall 17 opposite the door 15 and is preferably the male portion unitized by grouping connection points. The connection and receptacle devices 35, 47 make linear "stabbing" connection as the carrier 31 moves toward the rear chamber wall 17. When circuit boards 33 are handled and moved by a single carrier 31 as a single group or "unit," the device connecting and disconnecting forces are relatively high. And the carrier 31 is rather heavy when loaded with circuit boards 33.

For applications involving higher test temperatures, e.g., 150° C., the devices 35, 47 are configured as part of a port extension shown in U.S. application Ser. No. 520,124 filed on May 8, 1990, and incorporated herein.

As best seen in FIGS. 2 and 5, the system 10 also includes an insertion/extraction assembly 49 which powers the carrier 31 for movement between an interconnect position and a disconnect position as symbolically shown at 51 and 53, respectively, in FIG. 2. The circuit boards 33 are thereby substantially simultaneously connected to or disconnected from the receptacle device 47.

The insertion/extraction assembly 49 includes at least one and preferably two actuators 55 motor-driven for carrier movement. Each actuator 55 has a driving unit 57 (which does not "travel" in operation) and an extendable, retractable rod 59 mounted for linear movement left and right as viewed in FIG. 2. A preferred type of actuator 55 is of the ball screw type although other, equally workable types are discussed herein.

After manual, partial insertion of the carrier 31 into the chamber 11, alone or by a cart 41, the actuators 55 attach to and move the carrier 31 toward the rear chamber wall 17 to interconnect with the receptacle device 47 or away from such wall 17 to disconnect. Each actuator 55 has a hook-like member 61 movable linearly and pivotably for automatic carrier coupling and decoupling. Each hook-like member 61 has an insertion face 63 which engages and bears against a force member 65 such as a protruding pin on the carrier 31. The insertion face 63 is that transmitting motive force when the carrier 31 is being drawn toward the rear wall 17 for connection. Each member 61 also includes an extraction face 67 which bears against the force member 65 when the carrier 31 is being urged toward the door 15 for disconnection.

Pivoting movement of the hook-like member 61 is by a cam mechanism 69 of the pin-and-groove type. The pin 71 is on the member 61 and grooves 73 are configured in each of a pair of stationary plates 75 adjacent to and at either side of the member 61. As the actuator 55 and hook-like member 61 move in a "carrier out" direction, the cam mechanism 69 urges the member 61 downward and decouples it from the carrier 31. Since the connection device 35 has prior been disconnected from the receptacle device 47, the carrier 31 can then be withdrawn from the chamber 11.

In the case of two actuators 55, the preferred embodiment for larger systems, drive is by a direct current (DC) electric motor 77 for enhanced torque and a common line shaft 79 for substantially synchronous actuator movement. That is, actuators 55 hooked to either side of the carrier 31 move in unison. Synchronous movement is preferred to avoid the imposition of what is known as a force "couple" on the carrier 31. As is widely recognized in the mechanical engineering arts, a force couple 81 is a pair of equal forces (as represented by vectors 83) acting in parallel but opposite directions. To state it another way, synchronous movement helps avoid "torquing" or twisting the carrier 31 as may otherwise result if one actuator 55 led or lagged the other.

Referring further to FIGS. 2 and 5, the actuators 55 are aligned with the connection device 35 to avoid the imposition of a force couple (like couple 81 but acting vertically) on such device 35. Absent such alignment, there would be a tendency to cause the device 47 to tip or twist, thereby impairing the ability of the devices 35, 47 to interconnect.

More specifically, the centerlines of the actuator rods 59 are at substantially the same elevation as the horizontal centerline 85 of the device 47 and, for that matter, of the device 35. In the vernacular, the actuators 55 "straddle" the devices 35, 47.

In an arrangement not shown, if the actuators 55 straddled the devices 35, 47 vertically (rather than horizontally as illustrated), the centerlines of the rods 59 would be aligned with the vertical centerline of the device 35, 47. When the devices 35, 47 are urged together, an opposing insertion force is developed. With the described arrangement the insertion force and actuator forces are "balanced" and there is little if any tendency to tip or twist the device 35.

In addition to the actuators 55 and common line shaft 79, the assembly 49 includes a platform 89 and drive motor 77. The shaft 79, platform 89, drive motor 77 and all but relatively short lengths of the rods 59 are mounted exterior the chamber 11. Such location of this relatively large mass of metal and other material helps decrease the thermal load on the heating and refrigeration units 21, 23. In other words, by such placement of the aforementioned components, they will neither absorb heat or require cooling inside the chamber Referring additionally to FIG. 7, the electric drive motor 77 is connected to and powered from a motor control circuit 91, certain details of which will now be described. It is to be appreciated that even though the circuit 91 of FIG. 7 includes both control and power portions 93, 95 respectively, it is referred to herein as a control circuit 91. It is also to be appreciated that the circuit 91 uses an AC control circuit and a rectified DC power circuit.

In a chamber 11 prepared for testing, a rectangular, frame-like fixture 25 is attached to the chamber floor 27. The fixture 25 receives the carrier 31 and when the carrier 31 is properly positioned on the fixture 25 for coupling by the assembly 49, the switch LS103 is closed. This permits (but does not require) motor energization. In one arrangement positioning of the carrier 31 on the fixture 25 is by a cart 41 and the control circuit 91 includes a cart switch LS101 which is closed when the cart 41 is moved out of the chamber 11 to the degree necessary to prevent the cart 41 from being drawn into the chamber 11 when the motor 77 is energized.

The chamber 11 includes a door switch LS102 closed when the chamber door 15 is open and like that of the cart switch LS101, such switch closure permits motor energization. In this way, movement of the carrier 31 further into the chamber 11 to the interconnect position 51 may be observed through the open door 15.

In a highly preferred embodiment, it is desirable to move the carrier 31 relatively slowly when the connection and receptacle device 35, 47 are being connected or disconnected. On the other hand, the carrier 31 can safely be moved more rapidly when approaching connection or after disconnection. Accordingly, the control circuit 91 provides plural rates of carrier movement including a lower-speed rate for device connection and disconnection. Whenever the actuator head 97 is to the right of the switch LS108 as shown in FIG. 2, the switch LS108 is in the "up" position as shown in dashed line in FIG. 7. This connects the speed control potentiometer 99 in the circuit 91 and provides a slower motor speed.

The electric drive motor armature, connected line shaft 79 and the like have rather significant mass and, therefore, inertia. It is risky to instantaneously reverse the direction of motor rotation as drive component breakage may well result—and the carriermounted boards 33 may be damaged by resulting "jerky" movement. Movement of an automobile gear shift into reverse while travelling forward, even slowly, is a reasonable analogy.

To help prevent such eventualities, the preferred motor control circuit 91 also includes a timing switch S102 delaying reversal of the drive motor 77. In the described embodiment, two timing switches S102, S103 are included, one for each direction. Delay is for about three seconds permitting the armature and shaft 79 to coast to a stop (or virtual stop) before the motor 77 is energized for reverse rotation. The timing switches S102, S103 are of the integral "black box" type having but two connections and, no doubt, an actuating coil or similar (not shown).

The control circuit 91 also includes primary switches LS106, LS104 which "set" the interconnect and disconnect positions of the carrier 31 by limiting actuator travel. In the preferred embodiment, such switches LS106, LS104 are stationary mounted and the moving actuator head 97 has a "dog" 103 which trips a switch for slowdown or at a limit of travel. Of course, another arrangement (more difficult because of the need for sliding electrical contacts) is to mount the switches LS104, LS106, LS108 on the moving rod 59 and the dog 103 stationary.

There are also switches LS105, LS107 redundant to the primary switches LS104, LS106. In event of a primary switch failure, its redundant "backup" switch opens to stop actuator (and carrier) movement. A second actuator 55 is oriented generally parallel to and spaced from the actuator 55 seen in FIG. 2. Another way of describing this arrangement is that the second actuator 55 is "behind" the one illustrated. Switches LS105 and LS107 are positioned adjacent to such actuator 55 and are at locations slightly beyond the equivalent locations of the switches LS104 and LS106, respecctively. The redundant switches LS105, LS107 open only if a switch LS104 or LS106 fails and the actuator 55 overshoots.

In operation and referring to the FIGURES, it is assumed the rods 59 are fully extended to draw a carrier 31 toward the wall 17. It is also assumed the door 15 is open. When the operator "loads" a carrier at the proper position on the fixture 25, the switch LS103 closes. The operator then withdraws the cart 41, closing the switch LS101. The OUT-IN selector switch S101 is placed in the IN position, applying voltage to the coil 105 of the directional relay CR102. Its contacts 107 close, its contacts 110 open and since the switch LS103 is closed, power is applied to the timing switch S103. After about a 3 second delay, switch S103 closes and power is applied to the coil 109 of the relay CR101 and its contacts 111a, 111b close. Closure of contacts 111a applies AC power to the motor unit 113 where it is rectified for motor energization.

Thereupon, the actuator rods 59 draw to the right as shown in FIG. 2, the members 61 hook to the pins 65 and the carrier 31 is transported toward the rear wall 17 for connection. The carrier 31 moves on skids 115 covered with Teflon ® or other low friction material. As carrier movement proceeds, the dog 103 trips the switch LS108 and actuator speed slows. At the position where the devices 35, 47 are fully connected, the switch LS106 is tripped open, CR101 is de-energized, the contacts 111a and 111b open and the motor stops. Had LS106 failed for some reason, LS107 would have tripped to stop the motor 77. The door 15 is then closed, opening the switch LS102 to disable the system 10.

After circuit board testing and the chamber 11 returns to near-ambient temperature, the door 15 is opened, the switch LS102 closes and the selector switch S101 is turned to the OUT position. Since LS104 is closed, power is applied to the timing switch S102. After a delay, the contacts S102 close and power is applied to the coil 109 of the relay CR101—but not to the coil 105 of relay CR102. The contacts 110 are closed and reverse polarity power is applied to the motor 77.

As the carrier 31 nears its full extracted position, the switch LS104 is tripped to open and the motor 77 stops. If LS104 failed to open, redundant switch LS105 would trip to stop the motor 77.

It is important to appreciate each of several aspects of the invention and how variants thereof may be configured. Rather than group all connectors of a connection device 35 or receptacle device 47 into a single, relatively small area 37, such connectors could be arranged in closely-proximate plural groups. In smaller systems, it is feasible to use a smaller carrier 31 positioned by a single actuator 55 of a linear or other type. And there are other ways to get synchronous actuator movement in systems of various size, e.g., by hydraulic cylinders, selsyn drive motors, a manual crank or the like. Each of the foregoing equivalents—as well as others not outlined—are within the spirit and scope of the invention.

We claim:

1. An improved system for transporting electrical circuit boards into and out of an environmental chamber including:
   a movable carrier supporting plural circuit boards;
   an insertion/extraction assembly powering the carrier between a test position and a carrier removal position;
   the assembly including a motor exterior the chamber and at least one actuator extending into the chamber for assembly attachment to move the carrier between positions,
   whereby the circuit boards are substantially simultaneously transported between the positions.

2. The improved system of claim 1 wherein the carrier includes a connection device electrically linked to the boards and the actuator is aligned with the connection device thereby avoiding the imposition of a force couple on the connection device.

3. The improved system of claim 2 wherein the assembly includes plural actuators synchronized for movement thereby avoiding the imposition of a force couple on the carrier.

4. The improved system of claim 3 whereby carrier and actuator movement is substantially linear.

5. The improved system of claim 1 wherein the actuator positions a hook-like member movable for automatic carrier coupling and decoupling.

6. The improved system of claim 5 further including a cam mechanism de-coupling the hook-like member whereby the carrier may be withdrawn from the chamber following board testing.

7. The improved system of claim 6 wherein the carrier includes a force member and the hook-like member includes an insertion face bearing against the force member for moving the carrier to a test position and also includes an extraction face bearing against the force member for urging the carrier to the removal position.

8. The improved system of claim 1 wherein the insertion/extraction assembly includes plural actuators driven by a common line shaft for substantially synchronous actuator movement.

9. The improved system of claim 8 wherein the chamber includes heating and refrigeration units and the assembly further includes a platform exterior the chamber, thereby decreasing the thermal load on such units.

10. The improved system of claim 1 wherein the insertion/extraction assembly includes a motor control circuit providing plural rates of carrier movement including a lower-speed rate for moving the carrier into the test position.

11. The improved system of claim 10 including a fixture receiving the carrier and wherein:
    the control circuit includes a position switch closed when the carrier is positioned on the fixture whereby the motor may be energized.

12. The improved system of claim 11 wherein the carrier is positioned on the fixture by a cart and the control circuit includes a cart switch closed when the cart is sufficiently withdrawn from the chamber, whereby the motor may be energized.

13. The improved system of claim 12 wherein the chamber includes an access door and the control circuit includes a door switch closed when the door is open, whereby the motor may be energized and movement of the carrier to the test position may be observed.

14. The improved system of claim 1 wherein the insertion/extraction assembly includes a motor control circuit having primary switches setting the test and removal positions of the carrier by limiting travel of the actuator.

15. The improved system of claim 14 wherein the motor control circuit includes a timing switch delaying reversal of the drive motor.

16. The improved system of claim 1 wherein chamber operation is controlled by an operator and the carrier is self-supported for easy operator placement in such chamber, thereby obviating need for a separate carrier cart.

17. The improved system of claim 16 is supported on wheels and includes a grasping handle for operator use in placing such carrier.

* * * * *